United States Patent
Pilly et al.

(10) Patent No.: US 12,223,697 B1
(45) Date of Patent: Feb. 11, 2025

(54) SYSTEM AND METHOD FOR UNSUPERVISED CONCEPT EXTRACTION FROM REINFORCEMENT LEARNING AGENTS

(71) Applicant: HRL Laboratories, LLC, Malibu, CA (US)

(72) Inventors: Praveen K. Pilly, West Hills, CA (US); Nicholas A. Ketz, Topanga, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 275 days.

(21) Appl. No.: 17/901,703

(22) Filed: Sep. 1, 2022

Related U.S. Application Data

(63) Continuation-in-part of application No. 17/590,726, filed on Feb. 1, 2022, now Pat. No. 11,907,815, which
(Continued)

(51) Int. Cl.
*B60W 60/00* (2020.01)
*B60W 40/08* (2012.01)
(Continued)

(52) U.S. Cl.
CPC .......... *G06V 10/776* (2022.01); *G06V 10/761* (2022.01); *G06V 10/762* (2022.01); *G06V 10/774* (2022.01); *G06V 20/70* (2022.01)

(58) Field of Classification Search
CPC .. B60W 40/09; B60W 60/0054; B60W 50/14; B60W 50/08; G06N 3/0454;
(Continued)

(56) References Cited

U.S. PATENT DOCUMENTS

| 6,564,198 B1 * | 5/2003 | Narayan ............... G06N 3/042 706/60 |
| 9,785,145 B2 | 10/2017 | Gordon et al. |

(Continued)

FOREIGN PATENT DOCUMENTS

| CN | 106740114 A | * | 5/2017 | ............. B60K 35/00 |
| CN | 110222406 A | * | 9/2019 | ............. G06F 17/50 |

(Continued)

OTHER PUBLICATIONS

S. Greydanus, A. Koul, J. Dodge, and A. Fern, "Visualizing and Understanding Atari Agents," ArXiv171100138 Cs, Sep. 2018, Accessed: Jun. 23, 2020. [Online]. Available: http://arxiv.org/abs/1711.00138, pp. 1-10.

(Continued)

*Primary Examiner* — Yuri Kan
(74) *Attorney, Agent, or Firm* — TOPE-MCKAY & ASSOCIATES

(57) ABSTRACT

Described is a method for improved performance of agent-based machine learning. The method includes training a reinforcement learning (RL) agent on an image processing task. A dataset of states and corresponding actions is then extracted from the RL agent. A measure of attention is applied to an input space of the RL agent. During action selection by the RL agent, image patches of the input space are extracted based on the applied measure of attention. Portions of a set of inputs are clustered based on similarity to the image patches, generating a set of clusters having cluster centers. Non-semantic concept labels are provided as distances to the cluster centers for each state in the dataset.

12 Claims, 7 Drawing Sheets

Related U.S. Application Data is a continuation-in-part of application No. 16/900,145, filed on Jun. 12, 2020, now Pat. No. 11,420,655.

(60) Provisional application No. 63/290,031, filed on Dec. 15, 2021, provisional application No. 63/146,314, filed on Feb. 5, 2021, provisional application No. 62/906,269, filed on Sep. 26, 2019.

(51) Int. Cl.
| | | |
|---|---|---|
| *G06F 18/21* | (2023.01) | |
| *G06F 18/214* | (2023.01) | |
| *G06F 30/20* | (2020.01) | |
| *G06N 20/00* | (2019.01) | |
| *G06V 10/74* | (2022.01) | |
| *G06V 10/762* | (2022.01) | |
| *G06V 10/774* | (2022.01) | |
| *G06V 10/776* | (2022.01) | |
| *G06V 20/70* | (2022.01) | |

(58) Field of Classification Search
CPC .......... G06N 3/04; G06N 20/00; G06N 20/10; G06N 3/042; G06N 3/08; G06K 9/6262; B60K 31/00; B60K 35/00; B60K 31/0008; G06F 17/50; G06F 16/2457; G06V 40/165; G06V 10/764; G06V 10/776; G05D 1/0088; G06T 7/20; G06T 5/00; G08G 1/165
See application file for complete search history.

(56) References Cited

U.S. PATENT DOCUMENTS

| | | | | |
|---|---|---|---|---|
| 11,436,484 | B2 * | 9/2022 | Farabet | G06V 10/764 |
| 2011/0081073 | A1 * | 4/2011 | Skipper | G06K 9/6262 |
| | | | | 382/159 |
| 2018/0118219 | A1 | 5/2018 | Hiei et al. | |
| 2020/0111011 | A1 * | 4/2020 | Viswanathan | G06N 20/10 |
| 2020/0151562 | A1 * | 5/2020 | Pietquin | G06N 3/0454 |
| 2020/0293064 | A1 * | 9/2020 | Wu | G06T 7/20 |
| 2021/0053570 | A1 * | 2/2021 | Akella | G05D 1/0088 |
| 2021/0061298 | A1 * | 3/2021 | Balachandran | B60W 60/0054 |
| 2021/0101619 | A1 * | 4/2021 | Weast | G06F 16/2457 |
| 2021/0271968 | A1 * | 9/2021 | Ganin | G06N 3/08 |
| 2021/0284173 | A1 * | 9/2021 | Ohnishi | B60W 50/14 |

FOREIGN PATENT DOCUMENTS

| | | | | |
|---|---|---|---|---|
| DE | 102014224765 | A1 * | 6/2016 | G06V 40/165 |
| EP | 2256667 | B1 * | 6/2012 | G06K 9/00805 |
| FR | 2977056 | A1 * | 12/2012 | G06K 9/00281 |
| JP | 2015182526 | A * | 10/2015 | B60W 50/08 |
| JP | 2018062321 | A * | 4/2018 | B60K 31/0008 |
| JP | 6520066 | B2 * | 5/2019 | B60K 31/00 |
| KR | 20110119989 | A * | 11/2011 | G06T 5/00 |
| WO | WO-2016092796 | A1 * | 6/2016 | B60W 50/08 |
| WO | WO2019002465 | A1 | 1/2019 | |

OTHER PUBLICATIONS

S. Kolouri, C. E. Martin, and H. Hoffmann, "Explaining distributed neural activations via unsupervised learning," in Proceedings of the IEEE Conference on Computer Vision and Pattern Recognition Workshops, 2017, pp. 20-28.

Office Action 1 for U.S. Appl. No. 16/900,145, Date mailed: Dec. 29, 2021.

Response to Office Action 1 for U.S. Appl. No. 16/900,145, Date mailed: Mar. 29, 2022.

Notice of Allowance for U.S. Appl. No. 16/900,145, Date mailed: Apr. 29, 2022.

Dutordoir, V., Salimbeni, H., Deisenroth, M., & Hensman, J. (2018). Gaussian Process Conditional Density Estimation. ArXiv:1810.12750, pp. 1-19.

Fawcett, Tom (2006). "An Introduction to ROC Analysis". Pattern Recognition Letters. 27 (8): pp. 861-874.

Ketz, N., Kolouri, S., & Pilly, P. (2019). Using World Models for Pseudo-Rehearsal in Continual Learning. ArXiv:1903.02647, pp. 1-16.

Kansky K, et al., (2017). "Schema networks: Zero-Shot Transfer with a Generative Causal Model of Intuitive Physics." In Proceedings of the 34th International Conference on Machine Learning. vol. 70: pp. 1809-1818.

Kolouri, Soheil, Charles E. Martin, and Heiko Hoffmann. (2017). "Explaining Distributed Neural Activations via Unsupervised Learning." In CVPR Workshop on Explainable Computer Vision and Job Candidate Screening Competition, vol. 2, pp. 1670-1678.

Merrild, J., Rasmussen, M. A., & Risi, S. (2018). "HyperNTM: Evolving Scalable Neural Turing Machines through HyperNEAT." International Conference on the Applications of Evolutionary Computation, pp. 750-766.

Daftry, S., Zeng, S., Bagnell, J.A., and Hebert, M. (2016). "Introspective Perception: Learning to Predict Failures in Vision Systems." In 2016 IEEE/RSJ International Conference on Intelligent Robots and Systems (IROS), pp. 1743-1750.

Mnih, V., Kavukcuoglu, K., Silver, D., Rusu, A.A., Veness, J., Bellemare, M.G., Graves, A., Riedmiller, M., Fidjeland, A.K., Ostrovski, G. and Petersen, S. (2015). "Human-Level Control Through Deep Reinforcement Learning." Nature, 518 (7540), pp. 529-533.

Miikkulainen, R., Liang, J., Meyerson, E., Rawal, A., Fink, D., Francon, O., and Hodjat, B. (2019). "Evolving Deep Neural Networks." In Artificial Intelligence in the Age of Neural Networks and Brain Computing, pp. 293-312.

Pilly, P.K., Howard, M.D., and Bhattacharyya, R. (2018). "Modeling Contextual Modulation of Memory Associations in the Hippocampus." Frontiers in Human Neuroscience, 12, pp. 1-20.

Liou, Cheng-Yuan; Huang, Jau-Chi; Yang, Wen-Chie. (2008). "Modeling Word Perception Using the Elman Network". Neurocomputing 71 (2008), pp. 3150-3157.

Notification of Transmittal, the International Search Report, and the Written Opinion of the International Searching Authority for PCT/US2020/037468; date of mailing Sep. 23, 2020.

Brett W Israelsen, et al: "a Dave . . . I can assure you . . . that ita s going to be all right . . . a a Definition, Case for, and Survey of Algorithmic Assurances in Human-Autonomy Trust Relationships," ACM Computing Surveys, ACM, New York, NY, US, vol. 51, No. 6, Jan. 28, 2019 (Jan. 28, 2019), pp. 1-37, XP058426006.

Yunqi Zhao, et al: "Winning Isn't Everything: Enhancing Game Development with Intelligent Agents," Arxiv .Org, Cornell University Library, 201 Olin Library Cornell University Ithaca, NY 14853, Mar. 25, 2019 (Mar. 25, 2019), XP08 1465577.

Notification of the International Preliminary Report on Patentability Chapter I for PCT/US2020/037468; date of mailing Apr. 7, 2022.

The International Preliminary Report on Patentability Chapter I for PCT/US2020/037468; date of mailing Apr. 7, 2022.

Ketz, N., Kolouri, S., & Pilly, P. (2019). Using World Models for Pseudo-Rehearsal in Continual Learning. ArXiv:1903.02647 [Cs, Stat], pp. 1-16.

Kansky K, Silver T, Mély DA, Eldawy M, Lázaro-Gredilla M, Lou X, Dorfman N, Sidor S, Phoenix S, George D. (2017). Schema networks: Zero-shot transfer with a generative causal model of intuitive physics. In Proceedings of the 34th International Conference on Machine Learning-vol. 70, Aug. 6, 2017, pp. 1809-1818.

Kolouri, Soheil, Charles E. Martin, and Heiko Hoffmann (2017). "Explaining distributed neural activations via unsupervised learning." In CVPR Workshop on Explainable Computer Vision and Job Candidate Screening Competition, vol. 2. 2017, pp. 1670-1678.

Merrild, J., Rasmussen, M. A., & Risi, S. (2018). HyperNTM: Evolving scalable neural Turing machines through HyperNEAT. International Conference on the Applications of Evolutionary Computation, pp. 750-766. Springer.

(56) References Cited

OTHER PUBLICATIONS

Pilly, P. K., Howard, M. D., & Bhattacharyya, R. (2018). Modeling Contextual Modulation of Memory Associations in the Hippocampus. Frontiers in Human Neuroscience, Nov. 2018, vol. 12, Article 442, pp. 1-20.

Miikkulainen, R., Liang, J., Meyerson, E., Rawal, A., Fink, D., Francon, O., Raju, B., . . . & Hodjat, B. (2019) Evolving Deep Neural Networks, arXiv, 1703.00548, pp. 1-8.

Mnih, V., Badia, A.P., Mirza, M., Graves, A., Lillicrap, T., Harley, T., Silver, D. and Kavukcuoglu, K., 2016, June. Asynchronous methods for deep reinforcement learning. In International Conference on Machine Learning, pp. 1928-1937, PMLR.

Robins, A., 1995. Catastrophic forgetting, rehearsal and pseudorehearsal. Connection Science, 7(2), pp. 123-146.

Kaiser, L., Babaeizadeh, M., Milos, P., Osinski, B., Campbell, R.H., Czechowski, K., Erhan, D., Finn, C., Kozakowski, P., Levine, S. and Mohiuddin, A., 2019. Model-based reinforcement learning for Atari. arXiv preprint arXiv:1903.00374, pp. 1-28.

Dutordoir, V., Salimbeni, H., Deisenroth, M., & Hensman, J. (2018). Gaussian Process Conditional Density Estimation. ArXiv:1810.12750 [Cs, Stat], pp. 1-19.

Fawcett, Tom (2006). "An Introduction to ROC Analysis". Pattern Recognition Letters 27 (2006), pp. 861-874. doi:10.1016/j.patrec.2005.10.010.

Mnih, V, Kavukcuoglu, K, Silver, D, Rusu, A, Veness, J, Bellemare, M, Graves, A, Riedmiller, M, Fidjeland, A, Ostrovski, G, et al. (2015). Human-level control through deep reinforcement learning. Nature, 518(7540): pp. 529-533,2015.

Office Action 1 for U.S. Appl. No. 17/590,726, Date mailed: Jul. 12, 2023.

Response to Office Action 1 for U.S. Appl. No. 17/590,726, Date mailed: Oct. 11, 2023.

Notice of Allowance for U.S. Appl. No. 17/590,726, Date mailed: Oct. 23, 2023.

\* cited by examiner

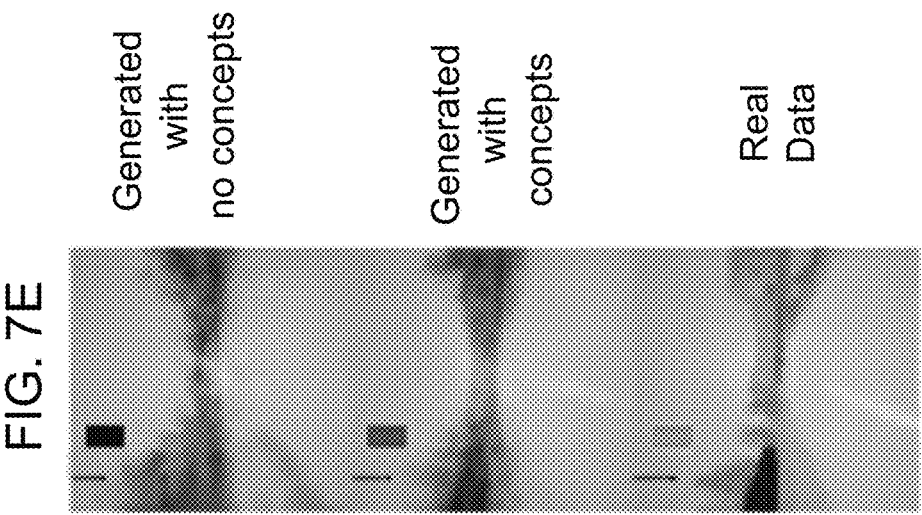
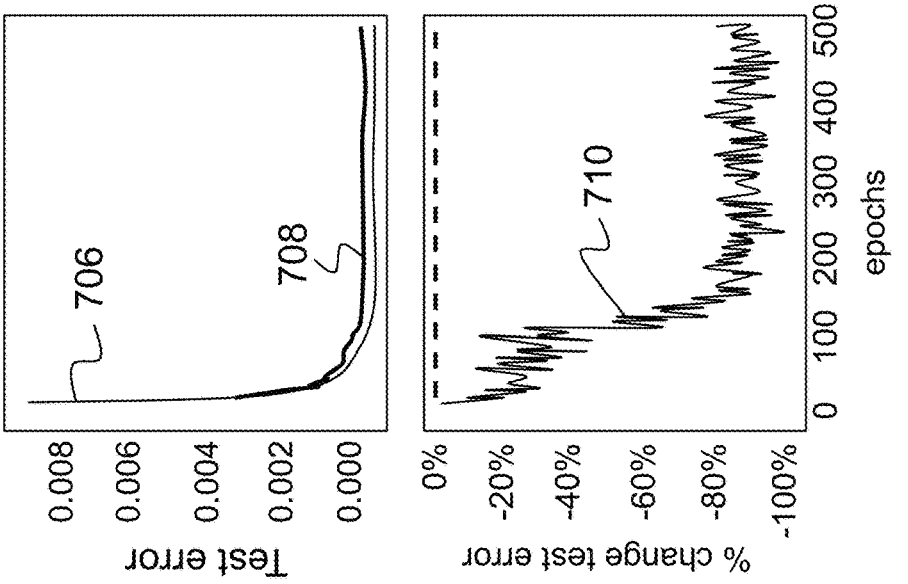
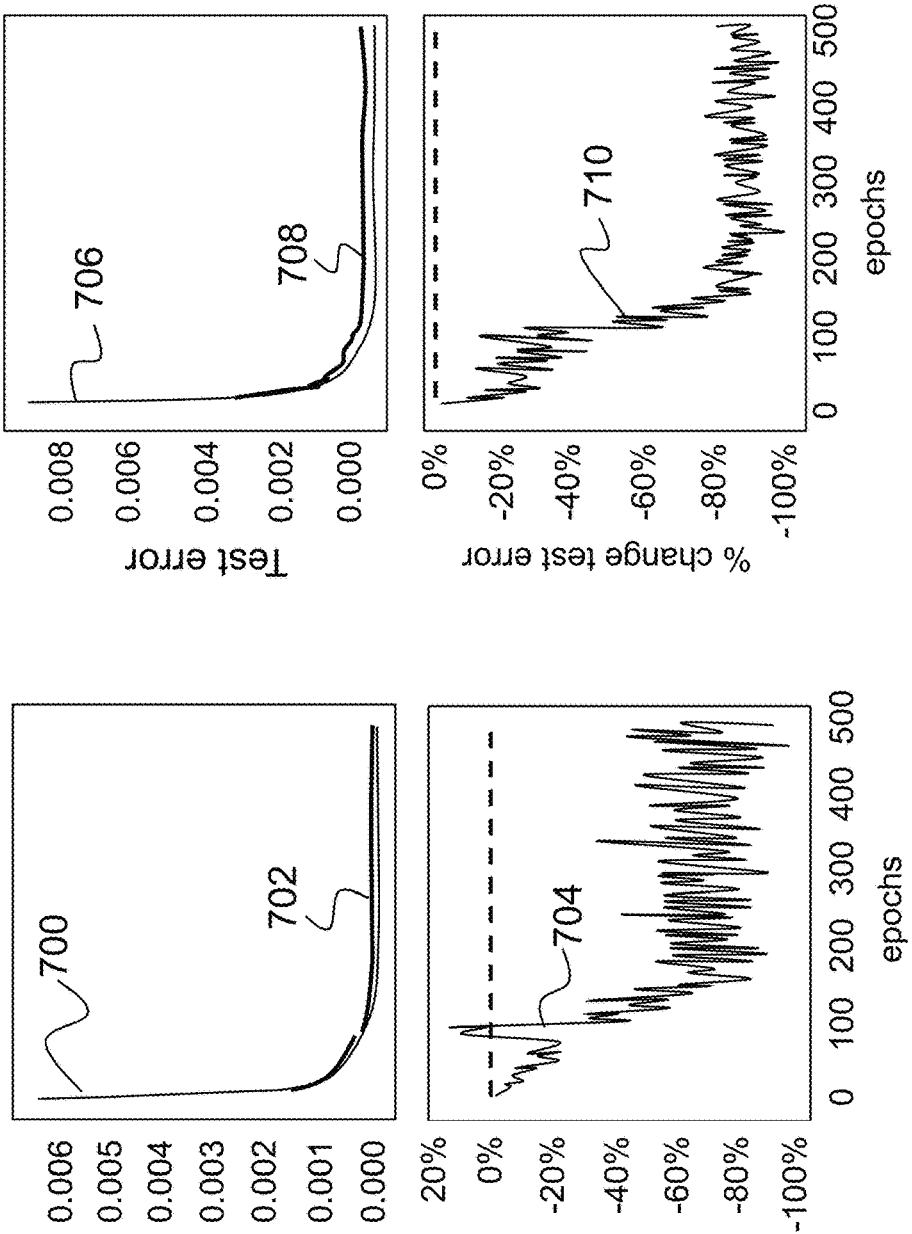

SYSTEM AND METHOD FOR UNSUPERVISED CONCEPT EXTRACTION FROM REINFORCEMENT LEARNING AGENTS

CROSS-REFERENCE TO RELATED APPLICATIONS

The present application is a Continuation-in-Part of U.S. Application No. 17/590,726, filed in the United States on Feb. 1, 2022, entitled, "System and Method for Improved Generalization from Concept Constrained Dreams", which is a Continuation-in-Part of U.S. application Ser. No. 16/900,145, filed in the United States on Jun. 12, 2020, entitled, "System and Method for Safety and Efficacy Override of an Autonomous System," which is a Non-Provisional Application of U.S. Provisional Application No. 62/906,269, filed in the United States on Sep. 26, 2019, entitled, "System and Method for Autonomous System Introspection," the entirety of which are incorporated herein by reference. U.S. Application No. 17/590,726 is also a Non-Provisional Application of U.S. Provisional Application No. 63/146,314, filed in the United States on Feb. 5, 2021, entitled, "System and Method for Improved Generalization from Concept Constrained Dreams," the entirety of which is incorporated herein by reference.

This is also a Non-Provisional Application of U.S. Provisional Application No. 63/290,031, filed in the United States on Dec. 15, 2021, entitled, "System and Method for Unsupervised Concept Extraction from Reinforcement Learning Agents," the entirety of which is incorporated herein by reference.

BACKGROUND OF INVENTION

(1) Field of Invention

The present invention relates to a system for unsupervised concept extraction from reinforcement learning agents and, more particularly, to a system for unsupervised concept extraction from reinforcement learning agents for improved performance of agent-based machine learning.

(2) Description of Related Art

Concept extraction is the grouping of words and phrases into semantically similar groups. There are several existing approaches to concept extraction, such as those described by Kolouri et al. in "Explaining Distributed Neural Activations via Unsupervised Learning," 2017 (hereinafter referred to as Kolouri), which are hereby incorporated by reference as though fully set forth herein. In response to salient patches, Kolouri clusters the features of the last convolution layer of neural networks that were trained to classify image categories for improving image classification performance, and for building smaller, more efficient, networks with similar performance to the original network. However, Kolouri is only applicable to neural networks based on classifying inputs into discrete categories.

Thus, a continuing need exists for an approach that does not require a convolutional network and can be applied to reinforcement learning networks, which do not have a clear target class for each image.

SUMMARY OF INVENTION

The present invention relates to a system for unsupervised concept extraction from reinforcement learning agents and, more particularly, to a system for unsupervised concept extraction from reinforcement learning agents for improved performance of agent-based machine learning. The system comprises one or more processors and a non-transitory computer-readable medium having executable instructions encoded thereon such that when executed, the one or more processors perform multiple operations. The system trains a reinforcement learning (RL) agent on an image processing task; extracts a dataset of a plurality of states and corresponding actions from the RL agent; applies at least one measure of attention to an input space of the RL agent; extracts, during action selection by the RL agent, a plurality of image patches of the input space based on the at least one measure of attention; clusters portions of a first set of inputs based on similarity to the plurality of image patches, thereby generating a first set of clusters having cluster centers; and provides non-semantic concept labels as distances to the cluster centers for each state in the dataset.

In another aspect, the system uses the non-semantic concept labels to retrain the RL agent on the image processing task to improve its performance.

In another aspect, the system uses the non-semantic concept labels to train another system that relies on the same input space.

In another aspect, the plurality of states corresponds to a plurality of image frames, and the system perturbs an image frame using a Gaussian filter centered on each pixel in the image frame; processes the perturbed image frame with the retrained RL agent to obtain an output; and compares the output to the image frame prior to perturbation to determine a saliency score for each pixel in the image frame.

In another aspect, the system determines a saliency map for the image frame based on the saliency scores of the pixels in the image frame; uses the saliency map to extract contiguous salient portions of the image frame; and filters the image frame using the extracted contiguous salient portions to highlight portions of the image frame for the RL agent to use for action selection.

Finally, the present invention also includes a computer program product and a computer implemented method. The computer program product includes computer-readable instructions stored on a non-transitory computer-readable medium that are executable by a computer having one or more processors, such that upon execution of the instructions, the one or more processors perform the operations listed herein. Alternatively, the computer implemented method includes an act of causing a computer to execute such instructions and perform the resulting operations.

BRIEF DESCRIPTION OF THE DRAWINGS

The objects, features and advantages of the present invention will be apparent from the following detailed descriptions of the various aspects of the invention in conjunction with reference to the following drawings, where:

FIG. 7A illustrates a comparison of training errors between concept-augmented inputs and original inputs according to some embodiments of the present disclosure;

FIG. 7B illustrates a percent change in training effort for concept-augmented inputs according to some embodiments of the present disclosure;

FIG. 7C illustrates a comparison of testing errors between concept-augmented inputs and original inputs according to some embodiments of the present disclosure;

FIG. 7D illustrates a percent change in testing errors for concept-augmented inputs according to some embodiments of the present disclosure; and FIG. 7E illustrates improvements in generated samples with a model augmented with concepts according to some embodiments of the present disclosure.

DETAILED DESCRIPTION

Figure 1:
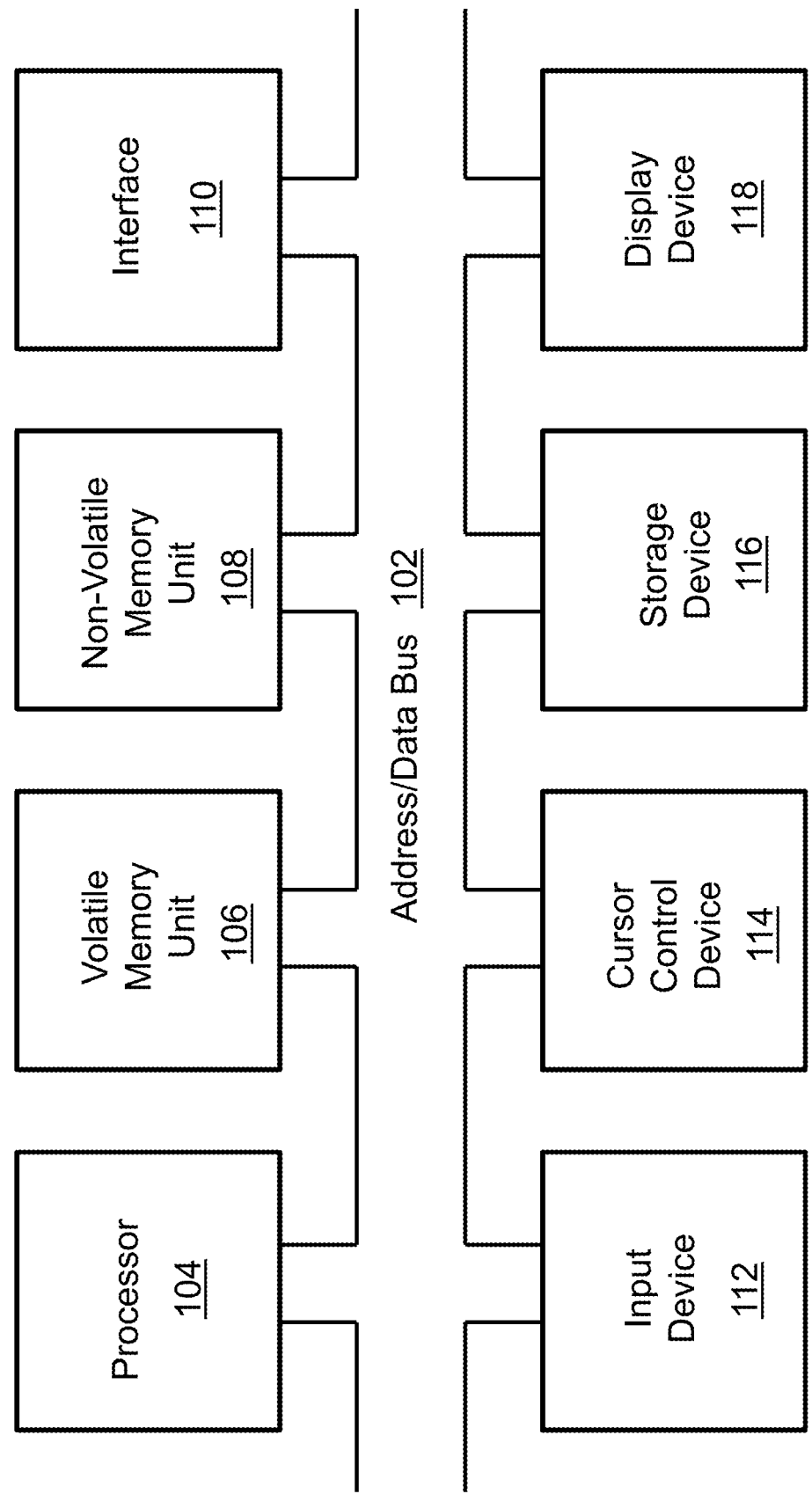
FIG. 1 is a block diagram depicting the components of a system for unsupervised concept extraction from reinforcement learning (RL) agents according to some embodiments of the present disclosure.

The present invention relates to a system for unsupervised concept extraction from reinforcement learning agents and, more particularly, to a system for unsupervised concept extraction from reinforcement learning agents for improved performance of agent-based machine learning. The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of aspects. Thus, the present invention is not intended to be limited to the aspects presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent, or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

(1) Principal Aspects

Various embodiments of the invention include three "principal" aspects. The first is a system for unsupervised concept extraction from reinforcement learning agents. The system is typically in the form of a computer system operating software or in the form of a "hard-coded" instruction set. This system may be incorporated into a wide variety of devices that provide different functionalities. The second principal aspect is a method, typically in the form of software, operated using a data processing system (computer). The third principal aspect is a computer program product. The computer program product generally represents computer-readable instructions stored on a non-transitory computer-readable medium such as an optical storage device, e.g., a compact disc (CD) or digital versatile disc (DVD), or a magnetic storage device such as a floppy disk or magnetic tape. Other, non-limiting examples of computer-readable media include hard disks, read-only memory (ROM), and flash-type memories. These aspects will be described in more detail below.

A block diagram depicting an example of a system (i.e., computer system 100) of the present invention is provided in FIG. 1. The computer system 100 is configured to perform calculations, processes, operations, and/or functions associated with a program or algorithm. In one aspect, certain processes and steps discussed herein are realized as a series of instructions (e.g., software program) that reside within computer readable memory units and are executed by one or more processors of the computer system 100. When executed, the instructions cause the computer system 100 to perform specific actions and exhibit specific behavior, such as described herein.

The computer system 100 may include an address/data bus 102 that is configured to communicate information. Additionally, one or more data processing units, such as a processor 104 (or processors), are coupled with the address/data bus 102. The processor 104 is configured to process information and instructions. In an aspect, the processor 104 is a microprocessor. Alternatively, the processor 104 may be a different type of processor such as a parallel processor, application-specific integrated circuit (ASIC), programmable logic array (PLA), complex programmable logic device (CPLD), or a field programmable gate array (FPGA).

The computer system 100 is configured to utilize one or more data storage units. The computer system 100 may include a volatile memory unit 106 (e.g., random access memory ("RAM"), static RAM, dynamic RAM, etc.) coupled with the address/data bus 102, wherein a volatile memory unit 106 is configured to store information and instructions for the processor 104. The computer system 100 further may include a non-volatile memory unit 108 (e.g., read-only memory ("ROM"), programmable ROM ("PROM"), erasable programmable ROM ("EPROM"), electrically erasable programmable ROM "EEPROM"), flash memory, etc.) coupled with the address/data bus 102, wherein the non-volatile memory unit 108 is configured to store static information and instructions for the processor 104. Alternatively, the computer system 100 may execute instructions retrieved from an online data storage unit such as in "Cloud" computing. In an aspect, the computer system 100 also may include one or more interfaces, such as an interface 110, coupled with the address/data bus 102. The one or more interfaces are configured to enable the computer system 100 to interface with other electronic devices and computer systems. The communication interfaces implemented by the one or more interfaces may include wireline (e.g., serial cables, modems, network adaptors, etc.) and/or wireless (e.g., wireless modems, wireless network adaptors, etc.) communication technology.

In one aspect, the computer system 100 may include an input device 112 coupled with the address/data bus 102, wherein the input device 112 is configured to communicate information and command selections to the processor 100. In accordance with one aspect, the input device 112 is an alphanumeric input device, such as a keyboard, that may include alphanumeric and/or function keys. Alternatively, the input device 112 may be an input device other than an alphanumeric input device. In an aspect, the computer system 100 may include a cursor control device 114 coupled with the address/data bus 102, wherein the cursor control device 114 is configured to communicate user input information and/or command selections to the processor 100. In an aspect, the cursor control device 114 is implemented using a device such as a mouse, a track-ball, a track-pad, an optical tracking device, or a touch screen. The foregoing notwithstanding, in an aspect, the cursor control device 114 is directed and/or activated via input from the input device 112, such as in response to the use of special keys and key sequence commands associated with the input device 112. In an alternative aspect, the cursor control device 114 is configured to be directed or guided by voice commands.

In an aspect, the computer system 100 further may include one or more optional computer usable data storage devices, such as a storage device 116, coupled with the address/data bus 102. The storage device 116 is configured to store information and/or computer executable instructions. In one aspect, the storage device 116 is a storage device such as a magnetic or optical disk drive (e.g., hard disk drive ("HDD"), floppy diskette, compact disk read only memory ("CD-ROM"), and digital versatile disk ("DVD")). Pursuant to one aspect, a display device 118 is coupled with the address/data bus 102, wherein the display device 118 is configured to display video and/or graphics. In an aspect, the display device 118 may include a cathode ray tube ("CRT"), liquid crystal display ("LCD"), field emission display ("FED"), plasma display, or any other display device suitable for displaying video and/or graphic images and alphanumeric characters recognizable to a user.

The computer system 100 presented herein is an example computing environment in accordance with an aspect. However, the non-limiting example of the computer system 100 is not strictly limited to being a computer system. For example, an aspect provides that the computer system 100 represents a type of data processing analysis that may be used in accordance with various aspects described herein. Moreover, other computing systems may also be implemented. Indeed, the spirit and scope of the present technology is not limited to any single data processing environment. Thus, in an aspect, one or more operations of various aspects of the present technology are controlled or implemented using computer-executable instructions, such as program modules, being executed by a computer. In one implementation, such program modules include routines, programs, objects, components and/or data structures that are configured to perform particular tasks or implement particular abstract data types. In addition, an aspect provides that one or more aspects of the present technology are implemented by utilizing one or more distributed computing environments, such as where tasks are performed by remote processing devices that are linked through a communications network, or such as where various program modules are located in both local and remote computer-storage media including memory-storage devices.

Figure 2:
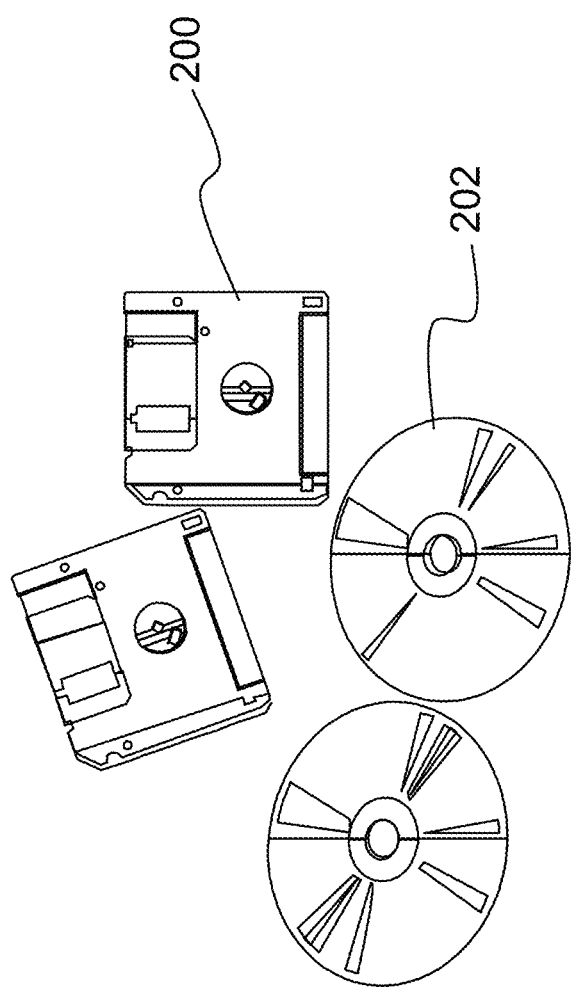
FIG. 2 is an illustration of a computer program product according to some embodiments of the present disclosure.

An illustrative diagram of a computer program product (i.e., storage device) embodying the present invention is depicted in FIG. 2. The computer program product is depicted as floppy disk 200 or an optical disk 202 such as a CD or DVD. However, as mentioned previously, the computer program product generally represents computer-readable instructions stored on any compatible non-transitory computer-readable medium. The term "instructions" as used with respect to this invention generally indicates a set of operations to be performed on a computer, and may represent pieces of a whole program or individual, separable, software modules. Non-limiting examples of "instruction" include computer program code (source or object code) and "hard-coded" electronics (i.e., computer operations coded into a computer chip). The "instruction" is stored on any non-transitory computer-readable medium, such as in the memory of a computer or on a floppy disk, a CD-ROM, and a flash drive. In either event, the instructions are encoded on a non-transitory computer-readable medium.

(2) Specific Details of Various Embodiments of the Invention

The present invention allows for the unsupervised extraction of high-level concepts from a trained reinforcement learning (RL) agent. In artificial intelligence, a learning agent is a type of agent that can learn from past experiences and adapt automatically through learning. Reinforcement learning trains an agent to complete a task within an uncertain environment. The RL agent receives observations and a reward from the environment and sends actions to the environment. The extracted concepts can be used to improve the RL agent's performance for better generalization and/or improve similar systems that have the same input space as the RL agent. Previous approaches have used the saliency measures to introspect on the trained agent's success or failure; however, the previous approaches did not perform unsupervised concept extraction from these saliency measures.

Described is a method for the unsupervised extraction and supervised consolidation of concepts that are implicitly encoded in trained parametric models (such as neural networks) of RL agents. The approach described herein applies measures of attention to trained RL agents in order to highlight portions of that agent's input space (e.g., RGB (red, green, blue) camera images), hereinafter referred to as "salient patches". Non-limiting examples of measures of attention that can be applied are described by Greydanus et al. in "Visualizing and Understanding Atari Agents", arXiv 1711.00138, 2018 (hereinafter referred to as Greydanus), the entirety of which is incorporated herein by reference. The salient patches are then used over a larger set of inputs to cluster together portions of the input space with high saliency that have similar features (e.g., cross-walk lines) in downstream ("high-level") layers of the RL agent neural network and designate various clusters of such features. These clusters in high-level layers can then be used to improve performance and efficiency in RL agents that also rely on the same inputs.

Figure 3:
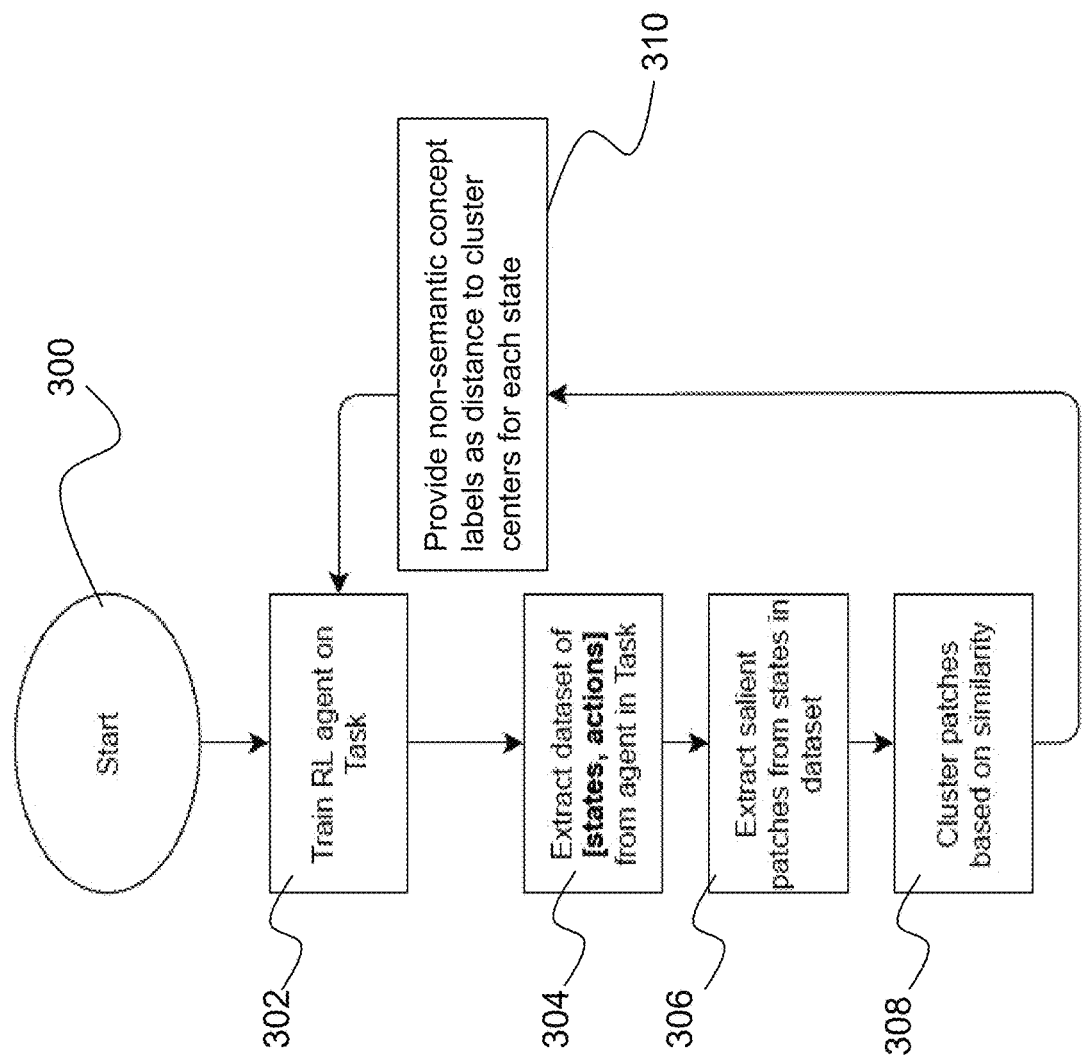
FIG. 3 is a flow diagram illustrating unsupervised concept extraction from RL agents according to some embodiments of the present disclosure.

FIG. 3 is a flow diagram depicting the method for unsupervised concept extraction from RL agents. The start 300 of the process begins with training a RL agent/system (comprising perception, memory, and action selection) on a task 302. Non-limiting examples of tasks include driving a car in the correct lane, flying a drone while avoiding collisions with obstacles, and searching for target objects in a 3D scene. After a reinforcement learning system has been trained, the concept extraction process can begin. The method extracts image patches determined to be of high saliency during the agent's action selection, as described by Greydanus. The extraction includes extracting a dataset of input states and actions from the RL agent 304. Then, salient patches are extracted from states in the dataset 306. The salient patches are clustered based on similarity of activations in downstream ("high-level") layers of the RL agent neural network 308. Non-limiting examples of measures of similarity include cosine similarity and Euclidean distance. Finally, non-semantic concept labels (activations) are provided as a distance (i.e., a numerical value) to cluster centers for each state 310. The concept labels can then be utilized to train the RL agent/system on the task 302. In this way, the concept labels can be incorporated into other systems that rely on the same input space as the RL agent the concepts were extracted from.

Figure 4:
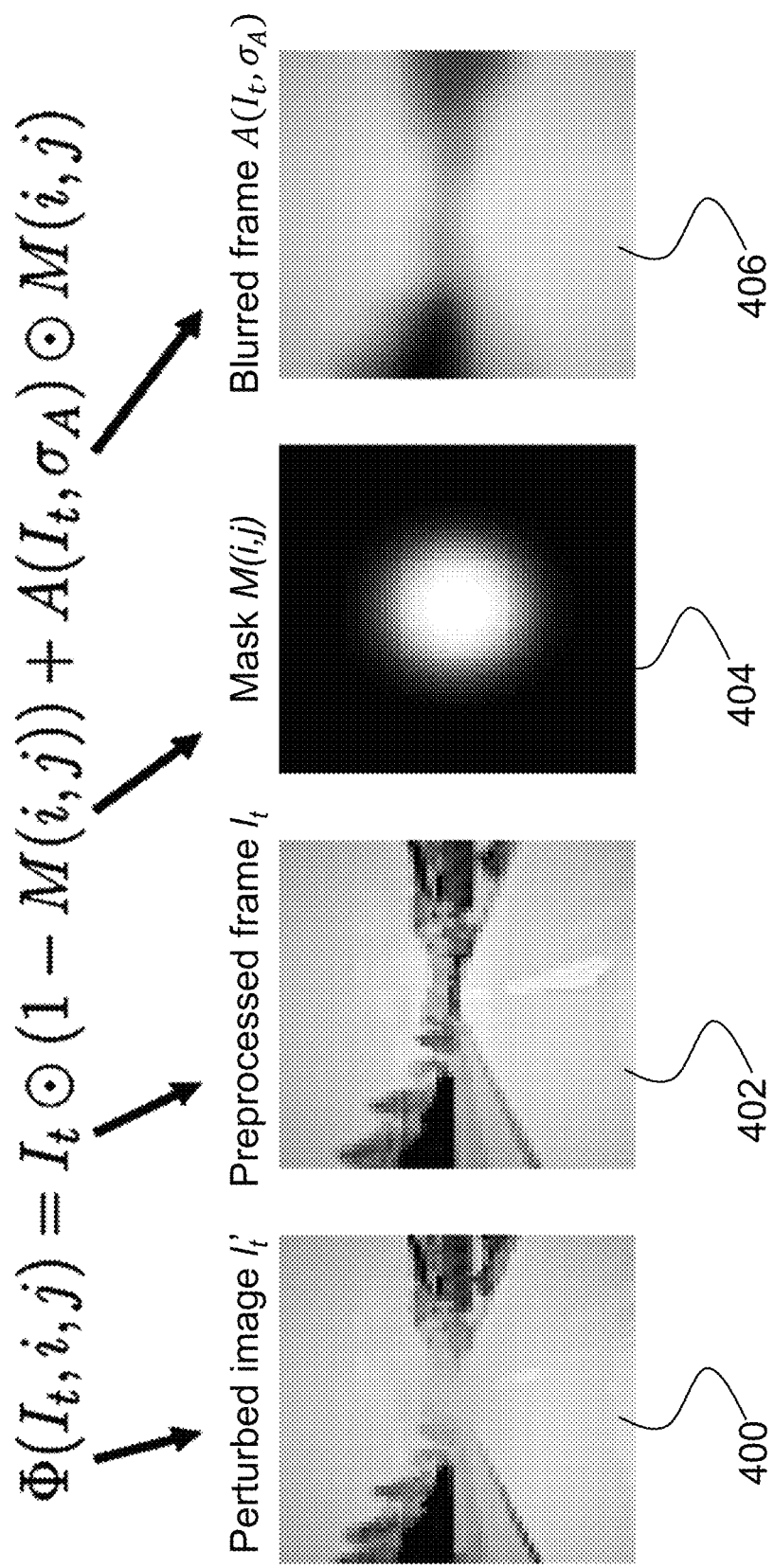
FIG. 4 is an illustration of concept extraction using the image perturbation pipeline according to some embodiments of the present disclosure.

FIG. 4 shows concept extraction using an image perturbation pipeline. Each pixel, as indicated by a given coordinate (i, j), within a given observation frame is perturbed by first blurring the preprocessed frame 402 to obtain the blurred frame 406 and then focusing the blur around that pixel using a Gaussian mask 404. The perturbed image 400, $\phi(I_t, i, j)$, is then processed by the trained RL agent/system to get a new action output. The relative change in this output compared to the unperturbed image is used as the saliency score for that pixel.

The saliency score can be calculated for each pixel in a given frame, and then for each frame in the dataset. The resulting saliency map for each input image can be used to extract connected components over that image (i.e., contiguous portions of the image that have high saliency). The connected components highlight what portions of the image are important to the RL agent for making its decisions. This information is then used to filter the image, preserving only the visual features that are important for action selection to generate binary masks called saliency components (element 500 in FIG. 5).

Figure 5:
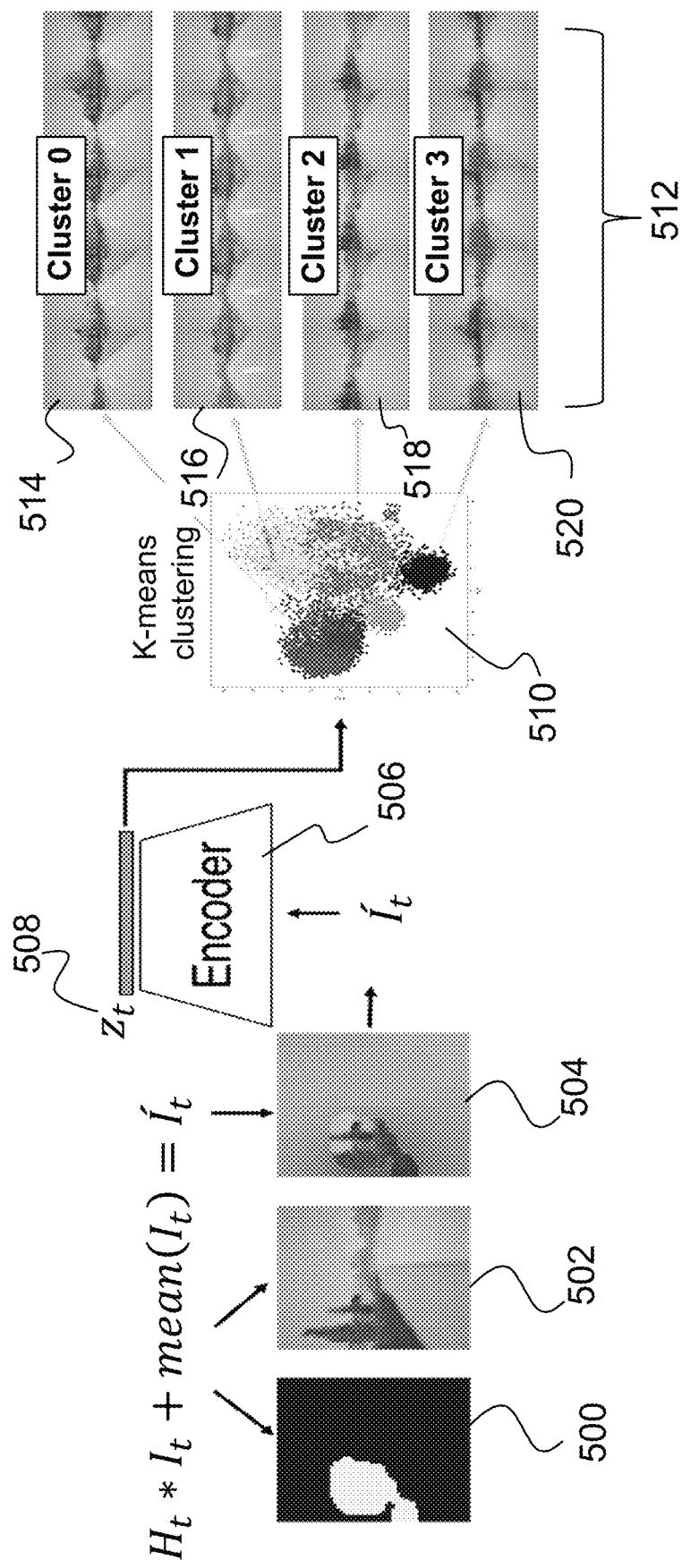
FIG. 5 is an illustration of K-means concept extraction and visualization according to some embodiments of the present disclosure.

FIG. 5 shows a given saliency component ($H_t$) 500 multiplied by its source image 502 ($I_t$), and with mean pixel value added across the frame, resulting in the filtered image 504 ($\tilde{I}_t$). This filtered image 504 is then processed by the system's encoder 506 (if present) to get a low-dimensional, compressed representation of the image 508 ($z_t$). Repeating this process for all available components over all available frames results in a large collection of z vectors. The z vectors are then clustered together using unsupervised clustering algorithms such as the K-means algorithm 510 to determine portions of the latent space that can be used as high-level descriptors of image patches that are relevant to agent behavior. This process is based on Kolouri, but is applied to the extraction of concepts in the latent space of encoders using agent-determined saliency in the pixel space. This is visualized on the right side of FIG. 5, where five samples from a set of four clusters 512 are shown. Here, the clusters can be seen with some interpretable consistency. For instance, Cluster 0 514 represents normal driving, Cluster 1 516 represents when the agent crosses the center line, Cluster 2 518 shows an oncoming obstacle, and Cluster 3 520 represents when the agent is encroaching on the left lane.

Using these concept labels as an additional descriptor of a given frame, the system (or other systems that use this input) can be retrained with this additional information to improve its performance. Specifically, for a given input image, the original image is concatenated with the concept labels; namely, softmax($-1*d(z_t)$) where $d(z_t)$ is the Euclidian distance from $z_t$ to the center of each cluster. Here, the values are continuous between 0 and 1, where high values indicate cluster centers that are close to the current image.

Figure 6:
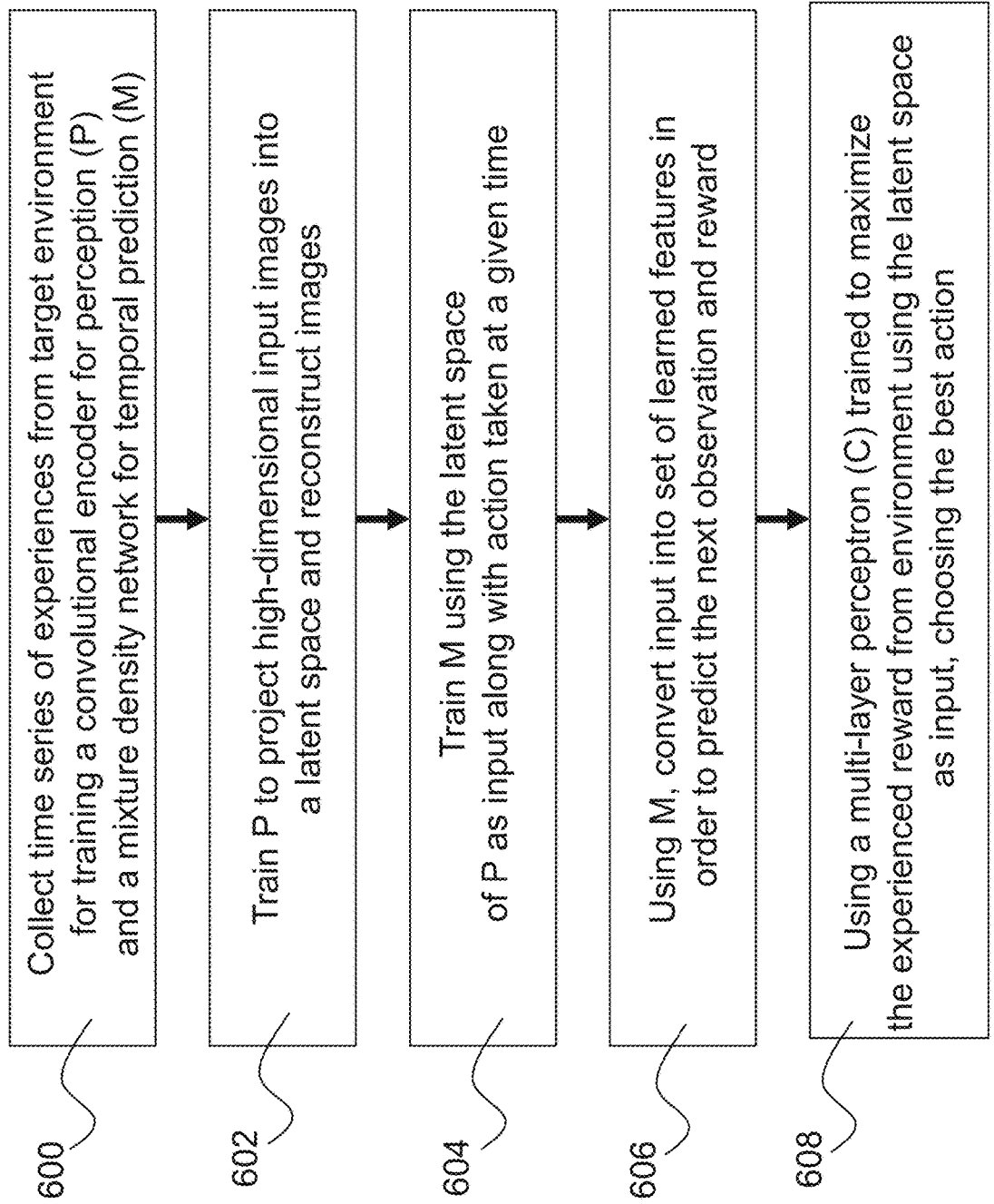
FIG. 6 is a flow diagram illustrating training RL agents according to some embodiments of the present disclosure.

A purpose of the method described herein is to extract useful concise descriptors of the input data (here referred to as "concepts") that can be used to improve the performance of systems that use that same data. To that end, an improved system architecture is implemented. In one embodiment, the architecture consists of a convolutional autoencoder used for perception (referred to as P), a temporal prediction network (referred to as M), and the action selection or reinforcement learning network (referred to as C). Training of this integrated system called the RL agent, comprising P, M, and C, is carried out in discrete steps rather than end-to-end, as shown in the flow diagram of FIG. 6. First, a time series of experiences (i.e., episodes) from the target environment is collected for training P and M (element 600). P is trained with the objective to project the high-dimensional input images into a reduced dimensional space (referred to as a latent space or $z_t$), and then reconstruct them (element 602) while minimizing the error between the input image and the reconstructed image. M is a mixture density network trained using the latent space of P as its input along with the action that was taken at a given time point (element 604). A mixture density network is a combination of a neural network and a mixture model. The neural network of M takes in the input and converts it into a set of learned features (element 606). M's objective is to predict the next observation ($\tilde{z}_t$) and the reward ($\tilde{r}_t$) experienced in the transition between timepoints. Finally, C is a multi-layer perceptron (part of the RL agent) trained to maximize the experienced reward from the environment using the latent space as input and choosing the best action ($a_t$) (element 608). A perceptron is a neural network unit that does certain computations to detect features in the input data.

The test environment for experimental studies was point-to-point navigation implemented in a driving simulator, such as the CARLA driving simulator. Each time step in the environment provides an RGB camera image from the driver's perspective as "observations". At each time step, one of nine discrete "actions" dictate a given steering angle and throttle level that is used to interact with the environment. "Rewards" in this environment are a simplified estimate of safe and effective driving from a starting position to a targeted end position, as follows:

$$r_t = 1000(d_{t-1}-d_t)+0.05(v_t-v_{t-1})-0.00002(c_t-c_{t-1})-2(s_t-s_{t-1})-2(o_t-o_{t-1})$$

Reward ($r_t$) for a given time point t is a weighted sum of five terms: distance traveled towards the goal $d_t$ in kilometers (km), speed $v_t$ in km/hour (h), collision damage $c_t$, intersection with the sidewalk $s_t$ (between 0 and 1), and intersection with the opposite lane $o_t$ (between 0 and 1). There are five start and end point pairs as defined driving routes during training. The timeseries data extracted from an agent's interaction with the environment is saved as a list of [observations, actions, rewards] for each time step. This collection of timeseries data is referred to as a "rollout" or "episode" of experience. For a given instantiation in the environment with a specific start and end point pair, the agent is allowed to interact with the environment for 300 time steps or until it reaches the prescribed end point. Using this setup, the P and M networks were first trained based on a set of episodes totaling 100,000 interactions with the environment, then the C model was trained using another 100,000 interactions with the environment using the Proximal Policy Optimization (PPO) algorithm described by Schulman et al. in "Proximal Policy Optimization Algorithms", arXiv 1707.06347, 2017 (hereinafter referred to as Schulman), the entirety of which is incorporated herein by reference.

After training the full system (as detailed in FIG. 6), the concept extraction occurs as described above and shown in FIG. 3. The concept-augmented input is then used to retrain the M network, and its loss curves are compared with the M model trained with the original input. These curves are shown in FIGS. 7A-7D for both training data (FIGS. 7A and 7B) and held-out test data (which is a portion of the data that was not used in training to assess generalization) (FIGS. 7C and 7D).

FIG. 7A compares training errors between concept-augmented inputs 700 and original inputs 702. FIG. 7B illustrates the percent change in training error for concept-augmented inputs 704. FIG. 7C compares testing errors between concept-augmented inputs 706 and original inputs 708. FIG. 7D illustrates the percent change in testing errors for concept-augmented inputs 710. Averaging over 500 epochs of training showed substantial reduction in both training and test error. Qualitatively, there were improvements in the quality and diversity of generated samples (in terms of matching the real data) with the M model augmented with concepts, as shown in FIG. 7E. Note three snapshots are shown: generated sample with the M model alone (top), generated sample with the M model augmented with concepts (middle), and real sample from the data (bottom)

In one or more embodiments, the method described herein can be applied to autonomous systems, such as autonomous vehicles or robotic systems. Commercial applications of the present invention include performance and sample efficiency improvements in trained RL systems, and related machine learning systems that rely on the same input space as the RL system (e.g., object identification, temporal prediction). A specific example, as described in U.S. Application No. 17/590,726, which is incorporated by reference as though fully set forth herein, is rapid generalization to rare failure cases (called corner cases) for autonomous systems that are only encountered during deployment. In this case, the M model augmented with concepts can generate realistic samples for other instances of the failure case using the concept labels that are activated in its single episode to seed the simulations. These generated data can then be used for extensive offline training to adapt to the failure case without any further interaction with the real environment.

Finally, while this invention has been described in terms of several embodiments, one of ordinary skill in the art will readily recognize that the invention may have other applications in other environments. It should be noted that many embodiments and implementations are possible. Further, the following claims are in no way intended to limit the scope of the present invention to the specific embodiments described above. In addition, any recitation of "means for" is intended to evoke a means-plus-function reading of an element and a claim, whereas any elements that do not specifically use the recitation "means for", are not intended to be read as means-plus-function elements, even if the claim otherwise includes the word "means". Further, while particular method steps have been recited in a particular order, the method steps may occur in any desired order and fall within the scope of the present invention.

What is claimed is:

1. A system for performance of agent-based machine learning with unsupervised concept extraction from reinforcement learning agents, the system comprising:
   one or more processors and a non-transitory computer-readable medium having executable instructions encoded thereon such that when executed, the one or more processors perform operations of:
   training a reinforcement learning (RL) agent on an image processing task;
   extracting a dataset of a plurality of states and corresponding actions from the RL agent, the plurality of states corresponding to a plurality of image frames;
   perturbing each image frame by blurring each pixel in the image frame and focusing the blur around each pixel using a Gaussian filter centered on the pixel;
   processing each image frame with the retrained RL agent to obtain an output;
   comparing the output to the image frame prior to perturbation to determine a saliency score for each pixel in each image frame;
   extracting, during action selection by the RL agent, a plurality of image patches of the input space based on the saliency score;
   clustering, using an unsupervised clustering algorithm, portions of a first set of inputs based on similarity to the plurality of image patches, thereby generating a first set of clusters having cluster centers; and
   providing non-semantic concept labels as distances to the cluster centers for each state in the dataset.

2. The system as set forth in claim 1, wherein the one or more processors further perform an operation of using the non-semantic concept labels, retraining the RL agent on the image processing task.

3. The system as set forth in claim 1, wherein the one or more processors further perform an operation of using the non-semantic concept labels, training another system that relies on the same input space.

4. The system as set forth in claim 1, wherein the one or more processors perform operations of:
   determining a saliency map for the image frame based on the saliency scores of the pixels in the image frame;
   using the saliency map, extracting contiguous salient portions of the image frame; and
   filtering the image frame using the extracted contiguous salient portions to highlight portions of the image frame for the RL agent to use for action selection.

5. A method for performance of agent-based machine learning with unsupervised concept extraction from reinforcement learning agents, the method comprising acts of:
   training a reinforcement learning (RL) agent on an image processing task;
   extracting a dataset of a plurality of states and corresponding actions from the RL agent, the plurality of states corresponding to a plurality of image frames;
   perturbing each image frame by blurring each pixel in the image frame and focusing the blur around each pixel using a Gaussian filter centered on the pixel;
   processing each image frame with the retrained RL agent to obtain an output;
   comparing the output to the image frame prior to perturbation to determine a saliency score for each pixel in each image frame;
   extracting, during action selection by the RL agent, a plurality of image patches of the input space based on the saliency score;
   clustering, using an unsupervised clustering algorithm, portions of a first set of inputs based on similarity to the plurality of image patches, thereby generating a first set of clusters having cluster centers; and
   providing non-semantic concept labels as distances to the cluster centers for each state in the dataset.

6. The method as set forth in claim 5, further comprising an act of using the non-semantic concept labels, retraining the RL agent on the image processing.

7. The method as set forth in claim 5, further comprising an act of using the non-semantic concept labels, training another system that relies on the same input space.

8. The method as set forth in claim 5, further comprising acts of:
- determining a saliency map for the image frame based on the saliency scores of the pixels in the image frame;
- using the saliency map, extracting contiguous salient portions of the image frame; and
- filtering the image frame using the extracted contiguous salient portions to highlight portions of the image frame for the RL agent to use for action selection.

9. A computer program product for performance of agent-based machine learning with unsupervised concept extraction from reinforcement learning agents, the computer program product comprising:
- a non-transitory computer-readable medium having executable instructions encoded thereon, such that upon execution of the instructions by one or more processors, the one or more processors perform operations of:
- training a reinforcement learning (RL) agent on an image processing task;
  - extracting a dataset of a plurality of states and corresponding actions from the RL agent, the plurality of states corresponding to a plurality of image frames;
  - perturbing each image frame by blurring each pixel in the image frame and focusing the blur around each pixel using a Gaussian filter centered on the pixel;
  - processing each image frame with the retrained RL agent to obtain an output;
  - comparing the output to the image frame prior to perturbation to determine a saliency score for each pixel in each image frame;
  - extracting, during action selection by the RL agent, a plurality of image patches of the input space based on the saliency score;
  - clustering, using an unsupervised clustering algorithm, portions of a first set of inputs based on similarity to the plurality of image patches, thereby generating a first set of clusters having cluster centers; and
  - providing non-semantic concept labels as distances to the cluster centers for each state in the dataset.

10. The computer program product as set forth in claim 9, further comprising instructions for causing the one or more processors to perform an operation of using the non-semantic concept labels, retraining the RL agent on the image processing task.

11. The computer program product as set forth in claim 9, further comprising instructions for causing the one or more processors to perform an operation of using the non-semantic concept labels, training another system that relies on the same input space.

12. The computer program product as set forth in claim 9, further comprising instructions for causing the one or more processors to perform operations of:
- determining a saliency map for the image frame based on the saliency scores of the pixels in the image frame;
- using the saliency map, extracting contiguous salient portions of the image frame; and
- filtering the image frame using the extracted contiguous salient portions to highlight portions of the image frame for the RL agent to use for action selection.

* * * * *